(12) United States Patent
Park et al.

(10) Patent No.: US 11,723,242 B2
(45) Date of Patent: Aug. 8, 2023

(54) DISPLAY APPARATUS HAVING DISPLAY AREA CONFIGURED TO ALLOW A SIGNAL TO PASS THERETHROUGH

(71) Applicant: SAMSUNG DISPLAY CO., LTD., Yongin-si (KR)

(72) Inventors: Junhyun Park, Yongin-si (KR); Hyeongseok Kim, Yongin-si (KR); Youngwan Seo, Yongin-si (KR); Yujin Lee, Yongin-si (KR); Cheolgon Lee, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 401 days.

(21) Appl. No.: 17/022,395

(22) Filed: Sep. 16, 2020

(65) Prior Publication Data
US 2021/0183984 A1 Jun. 17, 2021

(30) Foreign Application Priority Data
Dec. 17, 2019 (KR) .......................... 10-2019-0169180

(51) Int. Cl.
*H10K 59/131* (2023.01)
*H10K 59/40* (2023.01)
*H10K 59/124* (2023.01)
*H10K 59/121* (2023.01)

(52) U.S. Cl.
CPC ......... *H10K 59/131* (2023.02); *H10K 59/124* (2023.02); *H10K 59/1213* (2023.02); *H10K 59/40* (2023.02)

(58) Field of Classification Search
CPC ............... H01L 27/3276; H01L 27/323; H01L 27/3258; H01L 27/3262; H10K 59/131; H10K 59/40; H10K 59/1213; H10K 59/124
See application file for complete search history.

(56) References Cited

U.S. PATENT DOCUMENTS 10,345,942 B2   7/2019   Cho et al.
10,552,696 B2   2/2020   Cho et al.
(Continued)

FOREIGN PATENT DOCUMENTS

JP      2010230797 A    10/2010
KR      101650197 B1     8/2016
(Continued)

*Primary Examiner* — Lex H Malsawma
(74) *Attorney, Agent, or Firm* — Cantor Colburn LLP

(57) ABSTRACT

A display apparatus includes a first display area including a plurality of pixel areas, and a second display area including a plurality of pixel areas and a plurality of transmission areas and arranged adjacent to the first display area. The plurality of pixel areas each includes sub-pixels each including a pixel circuit and an organic light-emitting device electrically connected to the pixel circuit. The pixel circuit includes a thin-film transistor and an inorganic insulating layer on the thin-film transistor, and the thin-film transistor includes a semiconductor layer and a gate electrode. The organic insulated layer extends in the transmission areas. The second display area defines a dummy contact hole which passes through the inorganic insulating layer in at least one of the pixel areas and the transmission areas.

20 Claims, 12 Drawing Sheets

(56) References Cited

U.S. PATENT DOCUMENTS

| | | | | |
|---|---|---|---|---|
| 2013/0256648 A1* | 10/2013 | Nakatani | ............ | H01L 27/3246 |
| | | | | 438/34 |
| 2016/0284771 A1* | 9/2016 | Hwang | ............... | H01L 27/3262 |
| 2016/0321993 A1* | 11/2016 | Choi | .................... | G09G 3/3266 |
| 2017/0371464 A1* | 12/2017 | Nakanishi | ............. | G06F 3/0445 |
| 2018/0082630 A1* | 3/2018 | Kim | .................... | G09G 3/3233 |
| 2019/0189707 A1* | 6/2019 | Hyeon | ................ | H01L 27/3246 |

FOREIGN PATENT DOCUMENTS

| KR | 1020180067196 A | 6/2018 |
|---|---|---|
| KR | 1020180070785 A | 6/2018 |
| KR | 1020180073066 A | 7/2018 |

\* cited by examiner

DISPLAY APPARATUS HAVING DISPLAY AREA CONFIGURED TO ALLOW A SIGNAL TO PASS THERETHROUGH

This application claims priority to Korean Patent Application No. 10-2019-0169180, filed on Dec. 17, 2019, and all the benefits accruing therefrom under 35 U.S.C. § 119, the content of which in its entirety is herein incorporated by reference.

BACKGROUND

1. Field

One or more exemplary embodiments relate to a display apparatus.

2. Description of Related Art

Physical buttons have been removed from front surfaces of a display apparatus, and a display area for displaying images in the display apparatus has expanded. For example, a display apparatus may include a touch inputting unit configured to perform an input operation when a screen of the display apparatus is touched, and an image may be displayed even in an area in which separate members (e.g., sensors) configured to expand the functions of the display apparatus are arranged. To this end, sensors or the like may be positioned to overlap a display area for displaying images.

SUMMARY

When a separate member such as a sensor is located to overlap a display area, the display area needs to be configured to allow an external signal to pass therethrough for the sensing operation of the sensor. However, as the display area is configured to allow a signal to pass therethrough, inter-pixel characteristics may be changed, or touch sensitivity of a touch inputting unit may be deteriorated.

One or more exemplary embodiments include a display apparatus that prevents or minimizes a change in inter-pixel characteristics even when a display area is configured to allow a signal to pass therethrough, and prevents touch sensitivity of a touch inputting unit from being deteriorated.

Additional aspects will be set forth in part in the description which follows and, in part, will be apparent from the description, or may be learned by practice of the presented exemplary embodiments of the disclosure.

According to one or more exemplary embodiments, a display apparatus includes a first display area including a plurality of pixel areas, and a second display area including a plurality of pixel areas and a plurality of transmission areas and located adjacent to the first display area, where the plurality of pixel areas each includes sub-pixels each including a pixel circuit and an organic light-emitting device electrically connected to the pixel circuit, the pixel circuit includes a thin-film transistor and an inorganic insulating layer on the thin-film transistor, the thin-film transistor including a semiconductor layer and a gate electrode, the inorganic insulating layer extends in the transmission areas, and the second display area defines a dummy contact hole which passes through the inorganic insulating layer in at least one of the pixel areas and the transmission areas.

In an exemplary embodiment, the organic light-emitting device may include a pixel electrode, a common electrode on the pixel electrode, and an intermediate layer located between the pixel electrode and the common electrode and including an emission layer, and the common electrode may be integrally provided over the plurality of pixel areas and is not located in the transmission areas.

In an exemplary embodiment, in the second display area, the plurality of pixel areas forms a grid pattern, the transmission areas may be located between the pixel areas, and the dummy contact hole may be defined in a sub-pixel adjacent to two transmission areas of the transmission areas among the sub-pixels included in each of the pixel areas of the second display area.

In an exemplary embodiment, the dummy contact hole may not overlap metal layers included in the pixel circuit in a plan view.

In an exemplary embodiment, the display apparatus may further include a connection metal connected to the semiconductor layer on the inorganic insulating layer, and a planarization layer on the connection metal, and the organic light-emitting device may be located on the planarization layer, and the planarization layer fills the dummy contact hole.

In an exemplary embodiment, the semiconductor layer may be located on a substrate, and the display apparatus may further include a blocking layer in the second display area, where the blocking layer overlaps the pixel areas in a plan view and is located between the substrate and the semiconductor layer.

In an exemplary embodiment, the display apparatus may further include a buffer layer in which a first buffer layer and a second buffer layer including different materials from each other are stacked, where the buffer layer may be arranged on the substrate, and the blocking layer may be arranged between the first buffer layer and the second buffer layer.

In an exemplary embodiment, the dummy contact hole may be provided in plural, and the plurality of dummy contact holes may be located along an edge of the transmission area at a position adjacent to the pixel area of the second display area.

In an exemplary embodiment, the display apparatus may further include an input sensor arranged to correspond to the first display area and the second display area, where the input sensor may include first sensing electrodes and second sensing electrodes, the first sensing electrodes separated from each other by the transmission area may be connected to each other through a first connection line, the second sensing electrodes separated from each other by the transmission area may be connected to each other through a second connection line extending in a direction perpendicular to a direction in which the first connection line extends, and the first connection line and the second connection line may be located on different layers from each other.

In an exemplary embodiment, the dummy contact hole is provided in plural, and the first connection line and the second connection line may overlap at least one of the dummy contact holes in the plan view.

According to one or more exemplary embodiments, a display apparatus includes a display panel including a first display area and a second display area which have different resolutions from each other, and an input sensor located on the display panel, where the second display area includes a plurality of pixel areas and a plurality of transmission areas different from the plurality of pixel areas, the input sensor includes first sensing electrodes electrically connected to each other and second sensing electrodes electrically connected to each other, the first sensing electrodes separated from each other by the transmission area are electrically connected to each other through a first connection line, and the second sensing electrodes separated from each other by the transmission area are electrically connected to each other through a second connection line extending in a direction perpendicular to a direction in which the first connection line extends, and the first connection line and the second connection line are located on different layers from each other.

In an exemplary embodiment, the first sensing electrodes and the second sensing electrodes may be located in the same layer, and one of the first connection line and the second connection line may be located in the same layer as the first sensing electrodes and the other of the first connection line and the second connection line may be located in a different layer from the first connection line.

In an exemplary embodiment, a layer in which the first sensing electrodes are located and a layer in which the second sensing electrodes are located may be different from each other, the first connection line may be located in the same layer as the first sensing electrodes, and the second connection line may be located in the same layer as the second sensing electrodes.

In an exemplary embodiment, the plurality of pixel areas may each include sub-pixels each including a pixel circuit and an organic light-emitting device electrically connected to the pixel circuit, the pixel circuit may include a thin-film transistor and an inorganic insulating layer on the thin-film transistor, the thin-film transistor including a semiconductor layer and a gate electrode, the inorganic insulating layer may extends in the transmission areas, and the second display area may define a dummy contact hole passing through the inorganic insulating layer in at least one of the pixel areas and the transmission areas.

In an exemplary embodiment, in the second display area, the plurality of pixel areas may form a grid pattern, the transmission areas may be located between the pixel areas, the dummy contact hole may be provided in plural, and the plurality of dummy contact holes may be located along edges of the transmission areas at positions adjacent to the pixel areas, and the first connection line and the second connection line may overlap at least one of the plurality of dummy contact holes in a plan view.

In an exemplary embodiment, the display apparatus may further include a connection metal connected to the semiconductor layer on the inorganic insulating layer, and a planarization layer on the connection metal, and the organic light-emitting device may be located on the planarization layer, and the planarization layer fills the dummy contact hole.

In an exemplary embodiment, the organic light-emitting device may include a pixel electrode connected to the connection metal, a common electrode on the pixel electrode, and an intermediate layer located between the pixel electrode and the common electrode and including an emission layer, and the common electrode may be integrally provided throughout the first display area and the second display area and may not be located in the transmission areas.

In an exemplary embodiment, in the second display area, the plurality of pixel areas may form a grid pattern, the transmission areas may be located between the pixel areas, and the dummy contact hole may be defined in a sub-pixel adjacent to two transmission areas of the transmission areas among the sub-pixels included in each of the pixel areas.

In an exemplary embodiment, the dummy contact hole may not overlap metal layers included in the pixel circuit in a plan view.

In an exemplary embodiment, the semiconductor layer may be located on a substrate, and the display apparatus may further include a blocking layer overlapping the pixel areas and located between the substrate and the semiconductor layer in a plan view, and a component arranged below the substrate at a position overlapping the pixel areas and the transmission areas, and which senses an external signal.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION

Figure 1:
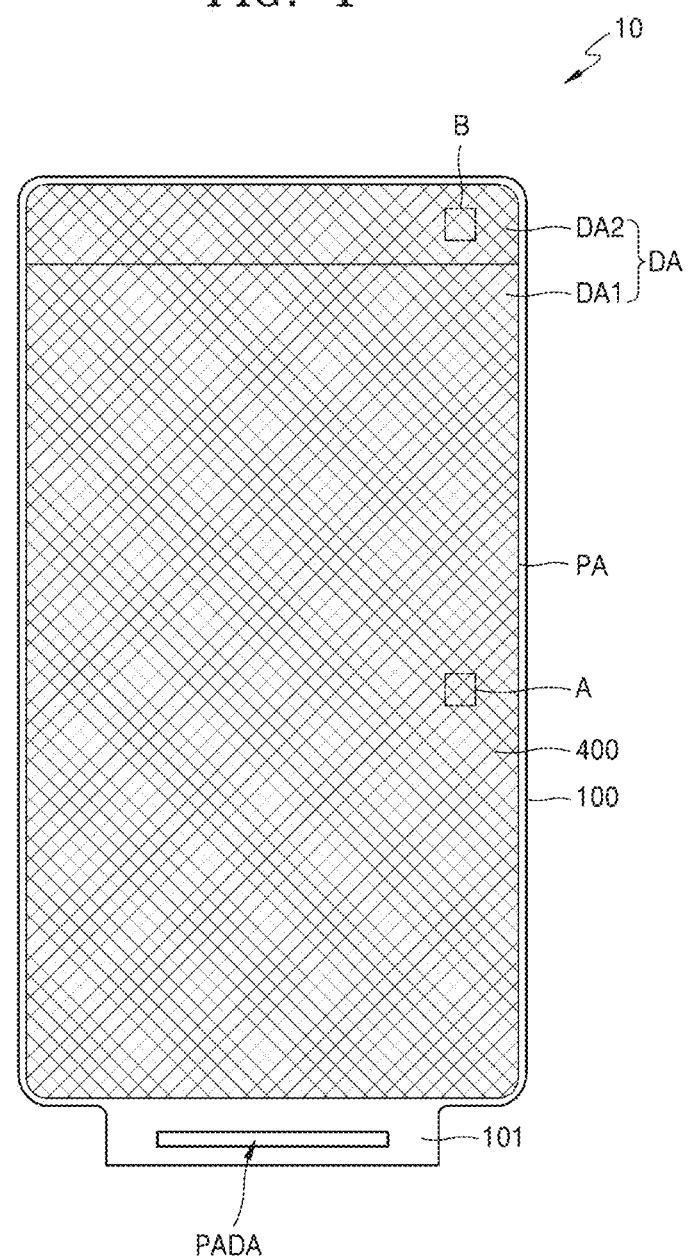
FIG. 1 is a plan view schematically illustrating an example of a display apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of components in the drawings may be exaggerated for convenience of description. In other words, since the sizes and thicknesses of elements in the drawings are arbitrarily illustrated for convenience of description, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

Hereinafter, exemplary embodiments will be described in detail with reference to the accompanying drawings. When describing exemplary embodiments with reference to the accompanying drawings, the same or corresponding elements are denoted by the same reference numerals and a redundant description thereof will be omitted.

Figure 2:
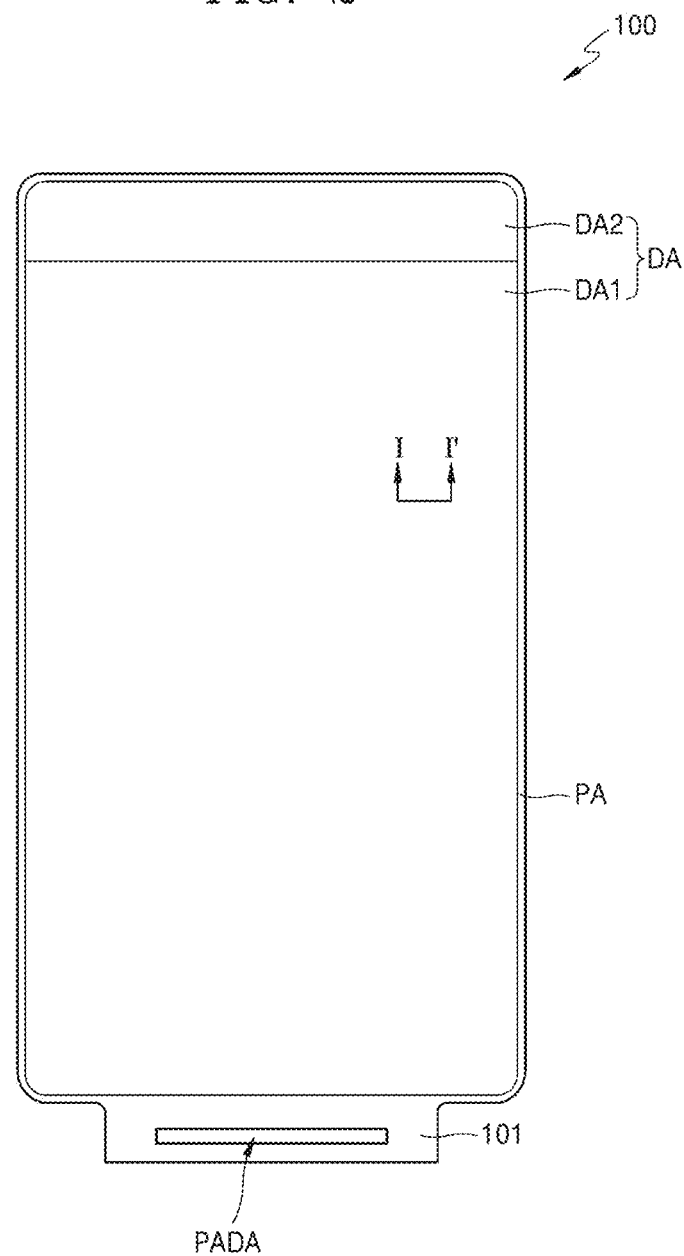
FIG. 2 is a plan view schematically illustrating an example of a display panel of the display apparatus of FIG. 1.

FIG. 1 is a plan view schematically illustrating an example of a display apparatus 10 according to an exemplary embodiment, and FIG. 2 is a plan view schematically illustrating an example of a display panel 100 of the display apparatus 10 of FIG. 1.

Referring to FIGS. 1 and 2, the display apparatus 10 according to the exemplary embodiment may include the display panel 100 and an input sensor 400 located above the display panel 100.

The display panel 100 may include a display area DA configured to allow an image to be displayed, and a peripheral area PA located outside the display area DA. A substrate 101 may be regarded as having the display area DA and the peripheral area PA.

A plurality of display elements may be located in the display area DA. For example, the display elements may be organic light-emitting devices ("OLEDs") and may emit red light, green light, blue light, or white light. The display area DA may include a first display area DA1 and a second display area DA2 which have different resolutions from each other.

Figure 3:
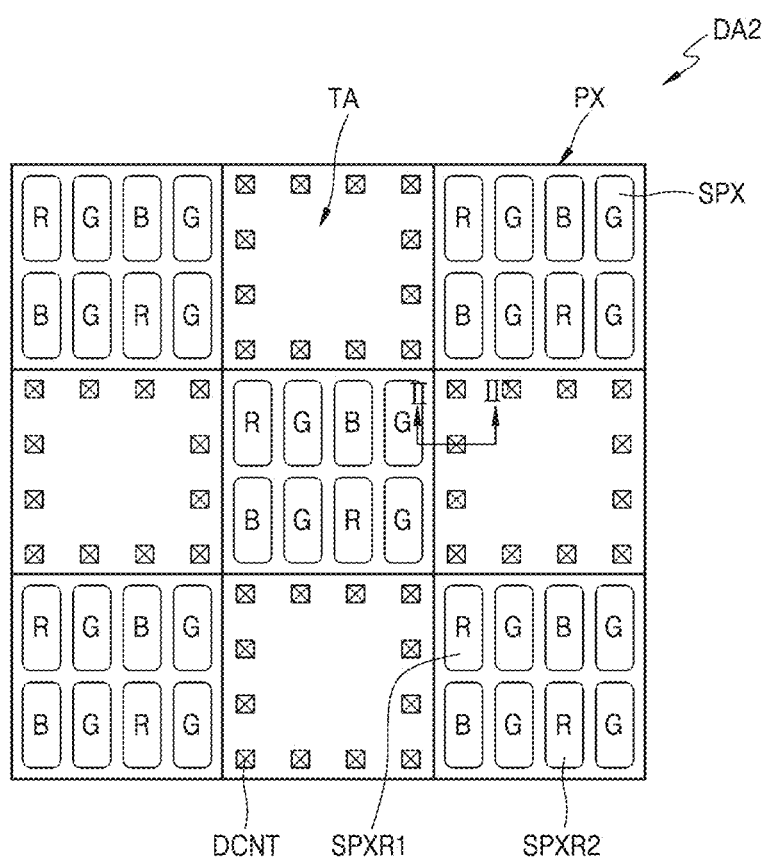
FIG. 3 is a plan view schematically illustrating an example of the arrangement of pixel areas and transmission areas in a second display area of FIG. 2.

The first display area DA1 may be a main display area and may include a plurality of pixel areas PX of FIG. 3. In the second display area DA2 adjacent to the first display area DA1, a sensor or the like using an optical signal or an acoustic signal may be arranged under the substrate 101. An optical sensor using an optical signal may include a camera, a fingerprint sensor, or the like for face identification ("ID"), iris recognition, or the like. That is, the second display area DA2 allows an image to be displayed together with the first display area DA1. The second display area DA2 may include pixel areas PX of FIG. 3 and transmission areas TA of FIG. 3 such that a sensor or the like receives an external optical signal and/or an acoustic signal through the transmission areas TA and outputs these signals from the sensor or the like to the outside of the display apparatus 10.

Therefore, the second display area DA2 may have a resolution lower than that of the first display area DA1. In other words, the number of pixel areas PX of FIG. 3 per unit area, which are arranged in the second display area DA2, may be less than that in the first display area DA1. For example, the resolution of the second display area DA2 may be about ½ of the resolution of the first display area DA1. In another exemplary embodiment, for example, the resolution of the first display area DA2 may be about 400 pixels per inch (ppi) or more, and the resolution of the second display area DA2 may be about 200 ppi.

A driver, a power supply line, or the like may be arranged in the peripheral area PA. In addition, the peripheral area PA may include a pad area PADA to which various electronic devices such as a driving integrated circuit or a printed circuit board are electrically attached.

Figure 8:
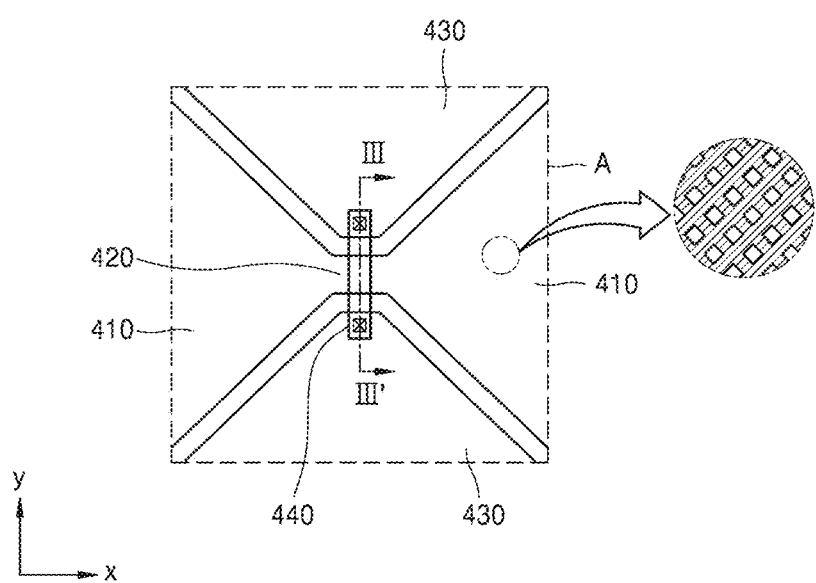
FIG. 8 is a plan view schematically illustrating an example of region A of FIG. 1.

The input sensor 400 may be located to correspond to the display area DA and may include first sensing electrodes 410 of FIG. 8 and second sensing electrodes 430 of FIG. 8 extending in directions intersecting each other. The input sensor 400 may generate an input signal by sensing a touch of an external touch inputting unit such as a user's hand or a pen.

FIG. 2 is a plan view illustrating the substrate 101 and the like during a process of manufacturing the display panel 100. In the display panel 100 or an electronic apparatus such as a smartphone including the display panel 100, part of the substrate 101 or the like may be bent so as to minimize the area of the peripheral area PA recognized by a user in the plan view. For example, the substrate 101 may be bent between the pad area PADA and the display area DA, such that at least part of the pad area PADA is located to overlap the display area DA in the plan view. A bending direction may be set such that the pad area PADA does not cover the display area but the pad area PADA is located behind the display area DA in the plan view. Therefore, a user may recognize the display area DA as occupying most of the display apparatus 10 in the plan view.

In addition, edges of the display area DA may be curved to have an outwardly convex shape. Therefore, when the display apparatus 10 of FIG. 1 is viewed from the front (i.e., plan view), edges of the display apparatus 10 of FIG. 1 may be recognized as having no bezel and an effect that the display area DA expands may be obtained.

Figure 4:
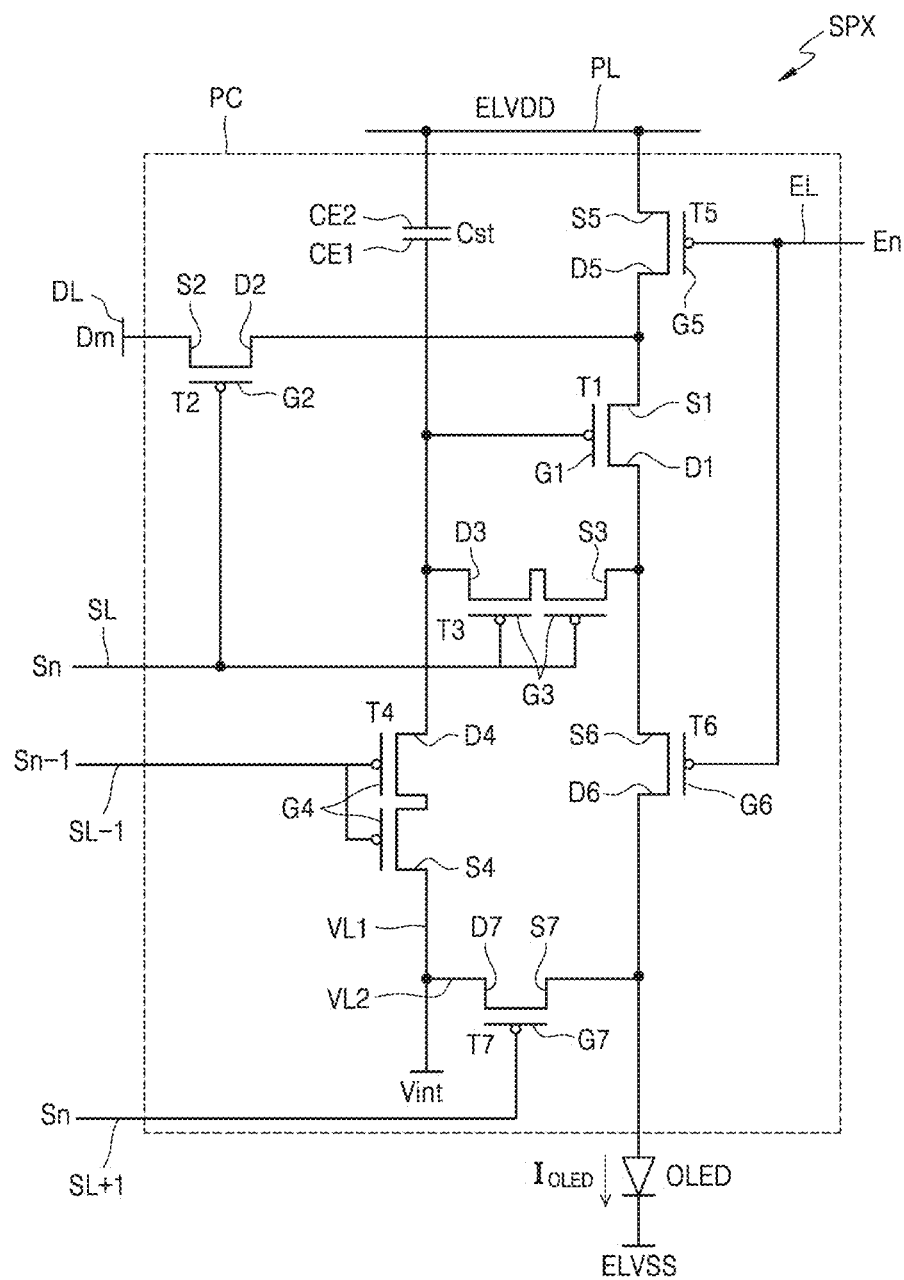
FIG. 4 is an equivalent circuit diagram of a single sub-pixel of FIG. 3.
Figure 5:
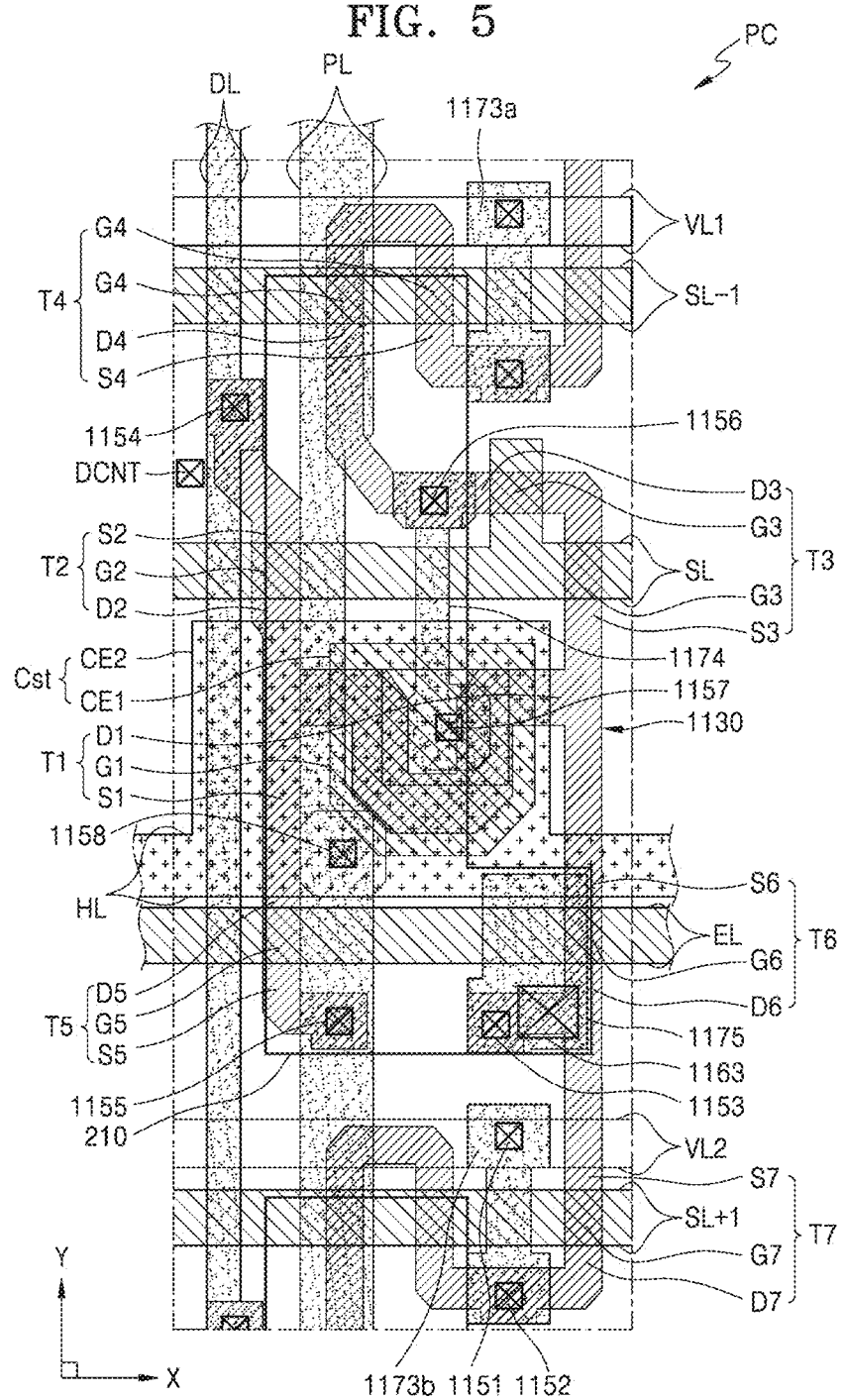
FIG. 5 is a plan view schematically illustrating a structure of a pixel circuit of the single sub-pixel of FIG. 3.
Figure 6:
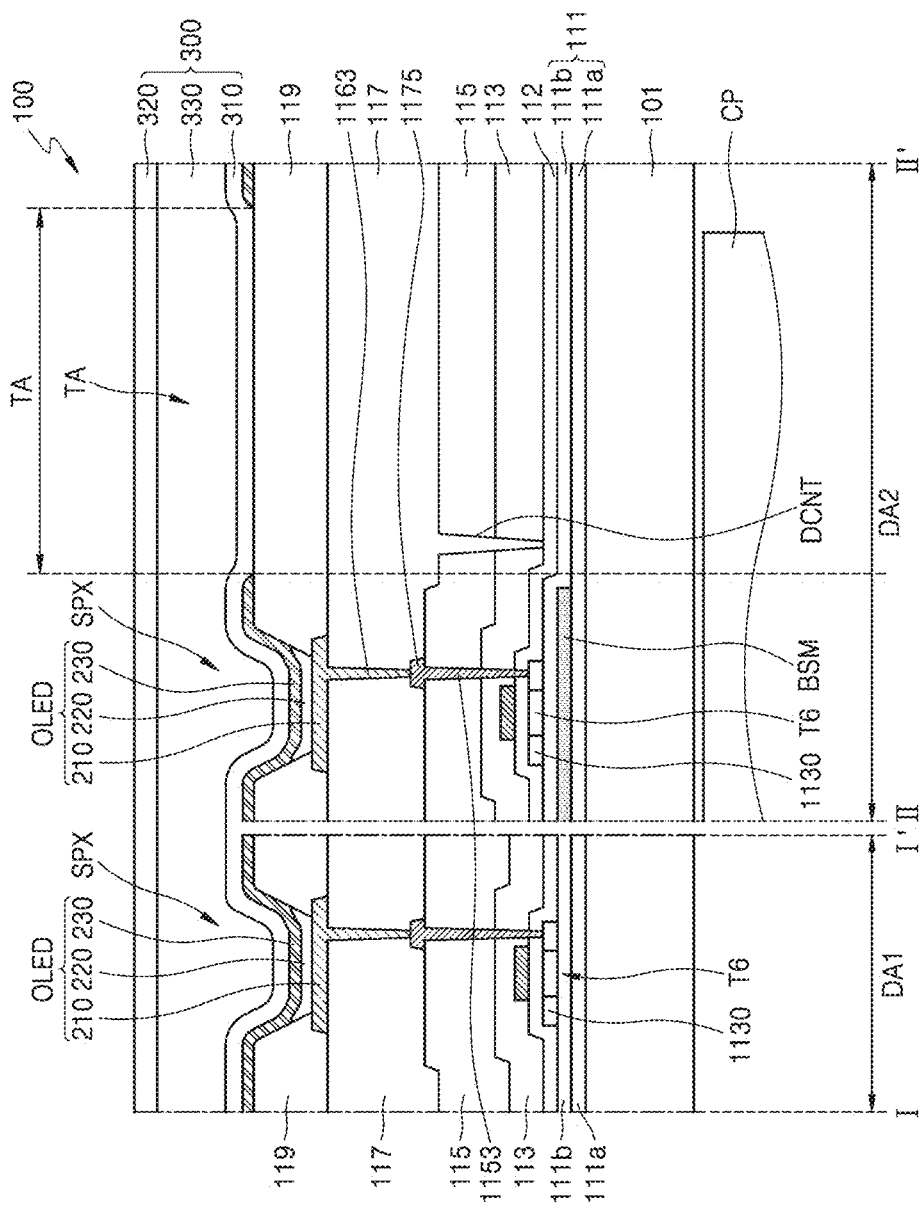
FIG. 6 is a cross-sectional view schematically taken along line I-I' of FIG. 2 and line II-II' of FIG. 3.
Figure 7:
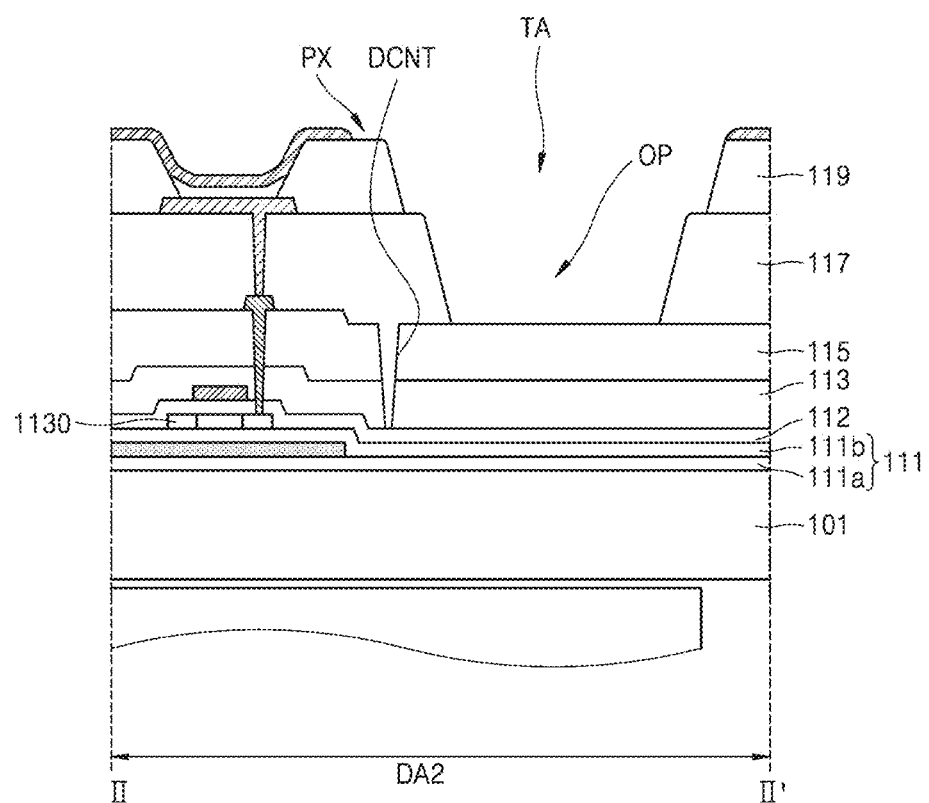
FIG. 7 is another exemplary embodiment of a cross-sectional view taken along line II-II' of FIG. 3.

FIG. 3 is a plan view schematically illustrating an example of the arrangement of pixel areas PX and transmission areas TA in the second display area DA2 of FIG. 2, FIG. 4 is an equivalent circuit diagram of a single sub-pixel SPX of FIG. 3, FIG. 5 is a plan view schematically illustrating a structure of a pixel circuit of the single sub-pixel SPX of FIG. 3, FIG. 6 is a cross-sectional view taken along line I-I' of FIG. 2 and line II-II' of FIG. 3, and FIG. 7 is another exemplary embodiment of a cross-sectional view taken along line II-II' of FIG. 3.

Referring to FIG. 3, the second display area DA2 may include the pixel areas PX and the transmission areas TA. The pixel areas PX may be arranged in the second display area DA2 more sparsely than in the first display area DA1 of FIG. 2. For example, the pixel areas PX may form a grid pattern, and the transmission areas TA may be located between the pixel areas PX. In contrast, the pixel areas PX may be densely arranged in the first display area DA1 of FIG. 2 without the transmission areas TA.

At least one sub-pixel SPX may be arranged in each of the pixel areas PX. For example, FIG. 3 illustrates an example in which eight sub-pixels SPX are arranged in the single pixel area PX in a pentile type, but the number and arrangement of sub-pixels SPX arranged in the single pixel area PX may be variously changed.

Hereinafter, the single sub-pixel SPX will be described in more detail with reference to FIGS. 4 and 5. Referring to FIGS. 4 and 5, the single sub-pixel SPX may include a pixel circuit PC and an organic light-emitting device OLED electrically connected to the pixel circuit PC.

For example, as illustrated in FIG. 4, the pixel circuit PC may include a plurality of thin-film transistors ("TFTs") T1 to T7 and a storage capacitor Cst. The TFTs T1 to T7 and the storage capacitor Cst may be electrically connected to signal lines SL, SL−1, SL+1, EL, and DL, a first initialization voltage line VL1, a second initialization voltage line VL2, and a driving voltage line PL.

The signal lines SL, SL−1, SL+1, EL, and DL may include a scan line SL configured to transfer a scan signal Sn, a previous scan line SL−1 configured to transfer a previous scan signal Sn−1 to a first initialization TFT T4, a subsequent scan line SL+1 configured to transfer the scan signal Sn to a second initialization TFT T7, an emission control line EL configured to transfer an emission control signal En to an operation control TFT T5 and an emission control TFT T6, and a data line DL configured to intersect the scan line SL and transfer a data signal Dm. The driving voltage line PL may be configured to transfer a driving voltage ELVDD to the driving TFT T1, the first initialization voltage line VL1 may be configured to transfer an initialization voltage Vint to the first initialization TFT T4, and the second initialization voltage line VL2 may be configured to transfer the initialization voltage Vint to the second initialization TFT T7.

A driving gate electrode G1 of the driving TFT T1 may be electrically connected to a lower electrode CE1 of the storage capacitor Cst. A driving source electrode S1 of the driving TFT T1 may be electrically connected to the driving voltage line PL through the operation control TFT T5. A driving drain electrode D1 of the driving TFT T1 may be electrically connected to a pixel electrode of the organic light-emitting device OLED through the emission control TFT T6. The driving TFT T1 may receive the data signal Dm according to a switching operation of the switching TFT T2 and supply a driving current $I_{OLED}$ to the organic light-emitting device OLED.

A switching gate electrode G2 of the switching TFT T2 may be electrically connected to the scan line SL. A switching source electrode S2 of the switching TFT T2 may be electrically connected to the data line DL. A switching drain electrode D2 of the switching TFT T2 may be electrically connected to the driving source electrode S1 of the driving TFT T1 and electrically connected to the driving voltage line PL through the operation control TFT T5. The switching TFT T2 may be turned on according to the scan signal Sn received through the scan line SL and perform a switching operation to transfer the data signal Dm received through the data line DL to the driving source electrode S1 of the driving TFT T1.

A compensation gate electrode G3 of the compensation TFT T3 may be electrically connected to the scan line SL. A compensation source electrode S3 of the compensation TFT T3 may be electrically connected to the driving drain electrode D1 of the driving TFT T1 and electrically connected to the pixel electrode of the organic light-emitting device OLED through the emission control TFT T6. A compensation drain electrode D3 of the compensation TFT T3 may be electrically connected to the lower electrode CE1 of the storage capacitor Cst, a first initialization drain electrode D4 of the first initialization TFT T4, and the driving gate electrode G1 of the driving TFT T1. The compensation TFT T3 may be turned on according to the scan signal Sn received through the scan line SL and electrically connect the driving gate electrode G1 of the driving TFT T1 to the driving drain electrode D1 of the driving TFT T1 to diode-connect the driving TFT T1.

A first initialization gate electrode G4 of the first initialization TFT T4 may be electrically connected to the previous scan line SL−1. A first initialization source electrode S4 of the first initialization TFT T4 may be electrically connected to the first initialization voltage line VL1. The first initialization drain electrode D4 of the first initialization TFT T4 may be electrically connected to the lower electrode CE1 of the storage capacitor Cst, the compensation drain electrode D3 of the compensation TFT T3, and the driving gate electrode G1 of the driving TFT T1. The first initialization TFT T4 may be turned on according to the previous scan signal Sn−1 received through the previous scan line SL−1 and perform an initialization operation to transfer the initialization voltage Vint to the driving gate electrode G1 of the driving TFT T1 to initialize the voltage of the driving gate electrode G1 of the driving TFT T1.

An operation control gate electrode G5 of the operation control TFT T5 may be electrically connected to the emission control line EL. An operation control source electrode S5 of the operation control TFT T5 may be electrically connected to the driving voltage line PL. An operation control drain electrode D5 of the operation control TFT T5 may be electrically connected to the driving source electrode S1 of the driving TFT T1 and the switching drain electrode D2 of the switching TFT T2.

An emission control gate electrode G6 of the emission control TFT T6 may be electrically connected to the emission control line EL. An emission control source electrode S6 of the emission control TFT T6 may be electrically connected to the driving drain electrode D1 of the driving TFT T1 and the compensation source electrode S3 of the compensation TFT T3. An emission control drain electrode D6 of the emission control TFT T6 may be electrically connected to a second initialization source electrode S7 of the second initialization TFT T7 and the pixel electrode of the organic light-emitting device OLED.

The operation control TFT T5 and the emission control TFT T6 may be simultaneously turned on according to the emission control signal En received through the emission control line EL and transfer the driving voltage ELVDD to the organic light-emitting device OLED so that the driving current $I_{OLED}$ flows through the organic light-emitting device OLED.

A second initialization gate electrode G7 of the second initialization TFT T7 may be electrically connected to the subsequent scan line SL+1. The second initialization source electrode S7 of the second initialization TFT T7 may be electrically connected to the emission control drain electrode D6 of the emission control TFT T6 and the pixel electrode of the organic light-emitting device OLED. A second initialization drain electrode D7 of the second initialization TFT T7 may be electrically connected to the second initialization voltage line VL2.

Since the scan line SL and the subsequent scan line SL+1 are electrically connected to each other, the same scan signal Sn may be applied to the scan line SL and the subsequent scan line SL+1. Therefore, the second initialization TFT T7 may be turned on according to the scan signal Sn received through the subsequent scan line SL+1 and initialize the pixel electrode of the organic light-emitting device OLED.

An upper electrode CE2 of the storage capacitor Cst may be electrically connected to the driving voltage line PL, and a common electrode of the organic light-emitting device OLED may be electrically connected to a common voltage ELVSS. Therefore, the organic light-emitting device OLED may receive the driving current $I_{OLED}$ from the driving TFT T1 and emit light to display an image.

The compensation TFT T3 and the first initialization TFT T4 are each illustrated in FIG. 4 as having a dual gate electrode, but the compensation TFT T3 and the first initialization TFT T4 may each have a single gate electrode in another exemplary embodiment.

Hereinafter, the single sub-pixel SPX will be described in more detail with reference to FIGS. 5 and 6. Since the sub-pixels SPX having the same structure may be included in the first display area DA1 and the second display area DA2 as illustrated in FIG. 6, the first display area DA1 and the second display area DA2 will be described without being distinguished. For convenience of description, in FIG. 6, only the emission control TFT T6 is illustrated in the pixel circuit PC.

The driving TFT T1, the switching TFT T2, the compensation TFT T3, the first initialization TFT T4, the operation control TFT T5, the emission control TFT T6, and the second initialization TFT T7 may be arranged along a semiconductor layer 1130. Some regions of the semiconductor layer 1130 may form the driving TFT T1, the switching TFT T2, the compensation TFT T3, the first initialization TFT T4, the operation control TFT T5, the emission control TFT T6, and the second initialization TFT T7.

The semiconductor layer 1130 may be disposed on the substrate 101. In another exemplary embodiment, a buffer layer 111 may be disposed on the substrate 101 and the semiconductor layer 1130 may be disposed on the buffer layer 111.

The substrate 101 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate, for example. The substrate 101 including the polymer resin may have flexible, rollable, or bendable characteristics. The substrate 101 may have a multi-layered structure including an inorganic layer (not illustrated) and a layer including the above-described polymer resin.

The buffer layer 111 may reduce or block penetration of foreign matter, moisture, or external air from the bottom of the substrate 101 and may provide a flat surface on the substrate 101. The buffer layer 111 may include an inorganic material such as oxide or nitride, an organic material, or an organic/inorganic composite and may have a single-layered structure or a multi-layered structure including an inorganic material and an organic material. For example, the buffer layer 111 may have a structure in which a first buffer layer 111a and a second buffer layer 111b are stacked. In this case, the first buffer layer 111a and the second buffer layer 111b may include different materials from each other. The first buffer layer 111a may include silicon nitride, for example, $SiN_x$. The second buffer layer 111b may include silicon oxide, for example, SiOx.

As such, when the first buffer layer 111a includes silicon nitride, hydrogen may be included in the forming of silicon nitride. In this manner, carrier mobility of the semiconductor layer 1130 disposed on the buffer layer 111 may be improved, thereby improving electrical characteristics of the TFT. In addition, the semiconductor layer 1130 may include a silicon material. In this case, interface bonding characteristics between the semiconductor layer 1130 including silicon and the second buffer layer 111b including silicon oxide may be improved, thereby improving electrical characteristics of the TFT.

The semiconductor layer 1130 may include low temperature poly-silicon ("LTPS"). The poly-silicon material has high electron mobility (100 square centimeters per volt second ($cm^2/Vs$) or more), low energy consumption, and excellent reliability. In another exemplary embodiment, the semiconductor layer 1130 may include amorphous silicon (a-Si) and/or oxide semiconductor. Some semiconductor layers among the TFTs may include LTPS and some semiconductor layers may include amorphous silicon (a-Si) and/or oxide semiconductor.

A first gate insulating layer 112 may be located on the semiconductor layer 1130. The scan line SL, the previous scan line SL−1, the subsequent scan line SL+1, and the emission control line EL may be located on the first gate insulating layer 112.

The first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$), for example.

Regions of the scan line SL overlapping channel regions of the switching TFT T2 and the compensation TFT T3 in the plan view may be the switching gate electrodes G2 and the compensation gate electrode G3, respectively. A region of the previous scan line SL−1 overlapping a channel region of the first initialization TFT T4 may be the first initialization gate electrode G4. A region of the subsequent scan line SL+1 overlapping a channel region of the second initialization TFT T7 may be the second initialization gate electrode G7. Regions of the emission control line EL overlapping channel regions of the operation control TFT T5 and the emission control TFT T6 may be the operation control gate electrode G5 and the emission control gate electrode G6, respectively.

The second gate insulating layer 113 may be provided on the scan line SL, the previous scan line SL−1, the subsequent scan line SL+1, and the emission control line EL. The second gate insulating layer 113 may include at least one of silicon oxide ($SiO_2$), silicon nitride ($SiN^x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$), for example.

An electrode voltage line HL, the first initialization voltage line VL1, and the second initialization voltage line VL2 may be arranged on the second gate insulating layer 113. The electrode voltage line HL may cover at least part of the driving gate electrode G1 and may form the storage capacitor Cst together with the driving gate electrode G1.

The lower electrode CE1 of the storage capacitor Cst may be integrally formed with the gate electrode G1 of the driving TFT T1. For example, the gate electrode G1 of the driving TFT T1 may function as the lower electrode CE1 of the storage capacitor Cst. A region of the electrode voltage line HL overlapping the driving gate electrode G1 in the plan view may be the upper electrode CE2 of the storage capacitor Cst. Therefore, the second gate insulating layer 113 may function as a dielectric layer of the storage capacitor Cst.

An interlayer insulating layer 115 may be located on the electrode voltage line HL, the first initialization voltage line VL1, and the second initialization voltage line VL2. The interlayer insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$), for example.

The data line DL, the driving voltage line PL, first and second initialization connection lines 1173a and 1173b, a node connection line 1174, and a connection metal 1175 may be arranged on the interlayer insulating layer 115. The data line DL, the driving voltage line PL, the node connection line 1174, and the connection metal 1175 may each include a conductive material including molybdenum (Mo), aluminum (Al), copper (Cu), titanium (Ti), or the like, and may each be a single layer or a multi-layer including the above-described material. For example, the data line DL, the driving voltage line PL, the node connection line 1174, and the connection metal 1175 may each have a multi-layered structure of Ti/Al/Ti.

The data line DL may be electrically connected to the switching source electrode S2 of the switching TFT T2 through a contact hole 1154. Part of the data line DL may be regarded as the switching source electrode S2.

The driving voltage line PL may be electrically connected to the upper electrode CE2 of the capacitor Cst through a contact hole 1158 defined in the interlayer insulating layer 115. Therefore, the electrode voltage line HL may have the same voltage level (e.g., constant voltage) as that of the driving voltage line PL. In addition, the driving voltage line PL may be electrically connected to the operation control source electrode S5 through a contact hole 1155.

The first initialization voltage line VL1 may be electrically connected to the first initialization TFT T4 through the first initialization connection line 1173a, and the second initialization voltage line VL2 may be electrically connected to the second initialization TFT T7 through the second initialization connection line 1173b. The first initialization voltage line VL1 and the second initialization voltage line VL2 may have the same constant voltage (e.g., −2 V, etc.).

One end of the node connection line 1174 may be electrically connected to the compensation drain electrode D3 through a contact hole 1156, and the other end of the node connection line 1174 may be electrically connected to the driving gate electrode G1 through a contact hole 1157.

The connection metal 1175 may be electrically connected to a semiconductor layer A6 of the light emission control TFT T6 through a contact hole 1153 passing through the interlayer insulating layer 115, the second gate insulating layer 113, and the first gate insulating layer 112. The emission control TFT T6 may be electrically connected to a pixel electrode 210 of the organic light-emitting device OLED through the connection metal 1175.

A planarization layer 117 may be located on the data line DL, the driving voltage line PL, the first and second initialization connection lines 1173a and 1173b, the node connection line 1174 and the connection metal 1175. The organic light emitting device OLED may be located on the planarization layer 117.

The structure of the single pixel circuit PC has been described with reference to FIGS. 4 and 5, but a plurality of sub-pixels SPX each having the same pixel circuit PC may be arranged in a first direction (x direction) and a second direction (y direction). In this case, the first initialization voltage line VL1, the previous scan line SL−1, the second initialization voltage line VL2, and the subsequent scan line SL+1 may be shared by two pixel circuits PC arranged adjacent to each other in the second direction (y direction).

That is, the first initialization voltage line VL1 and the previous scan line SL−1 of the pixel circuit PC illustrated in FIG. 5 may be electrically connected to a second initialization TFT T7 of another pixel circuit PC arranged above the pixel circuit PC illustrated in FIG. 5 in the second direction (y direction) on the basis of the drawing. Therefore, the previous scan signal Sn−1 applied to the previous scan line SL−1 of the pixel circuit PC illustrated in FIG. 5 may be transferred to the second initialization thin film transistor T7 of the other pixel circuit PC arranged above the pixel circuit PC illustrated in FIG. 5 in the second direction (y direction) as the subsequent scan signal. Similarly, the second initialization voltage line VL2 and the subsequent scan line SL+1 of the pixel circuit PC illustrated in FIG. 5 may be electrically connected to a first initialization TFT T4 of another pixel circuit PC arranged below the pixel circuit PC illustrated in FIG. 5 in the second direction (y direction) on the basis of the drawing and may be configured to transfer the previous scan signal Sn−1 and the initialization voltage Vint.

Referring to FIG. 6 again, the planarization layer 117 may have a flat upper surface such that the pixel electrode 210 may be formed to be flat. The planarization layer 117 may be a single layer or a multi-layer including an organic material. The planarization layer 117 may include a general-purpose polymer (for example, benzocyclobutene ("BOB"), polyimide, hexamethyldisiloxane ("HMDSO"), polymethylmethacrylate ("PMMA"), or polystyrene ("PS")), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or any blend thereof. In another exemplary embodiment, the planarization layer 117 may include an inorganic material. The planarization layer 117 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). When the planarization layer 117 includes an inorganic material, chemical planarization polishing may be performed. In another exemplary embodiment, the planarization layer 117 may include both the organic material and the inorganic material.

The organic light-emitting device OLED may include a pixel electrode 210, a common electrode 230, and an intermediate layer 220 arranged therebetween and including an emission layer.

The pixel electrode 210 may be electrically connected to the connection metal 1175 through a contact hole 1163, and the connection metal 1175 may be electrically connected to an emission control drain region of the emission control TFT T6 through the contact hole 1153.

The pixel electrode 210 may be a (semi)transmissive electrode or a reflective electrode. In one or more exemplary embodiments, the pixel electrode 210 may include a reflective film and a transparent or a semitransparent electrode layer arranged above the reflective film. The reflective film may include Ag, Mg, Al, Pt, Pd, Au, Ni, Nd, Ir, Cr, or any compound thereof, for example. The transparent or semitransparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"), for example. In one or more exemplary embodiments, the pixel electrode 210 may have a stacked structure of ITO/Ag/ITO.

A pixel defining layer 119 may be arranged on the planarization layer 117. The pixel defining layer 119 may define an opening configured to expose a central portion of the pixel electrode 210, thereby defining the emission area of the pixel. In addition, the pixel defining layer 119 may increase a distance between the edge of the pixel electrode 210 and the common electrode 230 above the pixel electrode 210, thereby preventing arc or the like from occurring at the edge of the pixel electrode 210. The pixel defining layer 119 may include at least one organic insulating material such as polyimide, polyamide, an acrylic resin, benzocyclobutene, hexamethyldisiloxane (HMDSO), or a phenol resin, for example, and may be formed by spin coating or the like.

The intermediate layer 220 may include an organic emission layer. The organic emission layer may include an organic material including a fluorescent or phosphorescent material emitting light of a red color, a green color, a blue color, or a white color. The organic emission layer of the intermediate layer 220 may be a low-molecular-weight organic material or a high-molecular-weight organic material. Functional layers such as a hole transport layer ("HTL"), a hole injection layer ("HIL"), an electron transport layer ("ETL"), and an electron injection layer ("EIL") may optionally be further arranged above and/or below the organic emission layer. The intermediate layer 220 may be arranged to correspond to each of a plurality of pixel electrodes 210. However, exemplary embodiments according to the invention are not limited thereto. In another exemplary embodiment, at least some layers included in the intermediate layer 220 may be integrally formed over the pixel electrodes 210.

The common electrode 230 may be a transmissive electrode or a reflective electrode. In one or more exemplary embodiments, the common electrode 230 may be a transparent or semitransparent electrode and may include a metal thin-film that has a low work function and includes Li, Ca, LiF/Ca, LiF/Al, Al, Ag, Mg, or any compound thereof. In addition, a transparent conductive oxide ("TCO") film such as ITO, IZO, ZnO, or $In_2O_3$ may be further arranged on the metal thin-film of the common electrode 230.

The common electrode 230 may be integrally formed to correspond to the pixel electrodes 210. More specifically, the common electrode 230 may be formed to correspond to the entire first display area DA1 and the pixel area PX of the second display area DA2. That is, the common electrode 230 is not provided in the transmission area TA. The transmission area TA is an area through which an optical signal and/or an acoustic signal emitted from a component CP passes. In order to improve the transmittance of the transmission area TA, the common electrode 230 is not disposed in the transmission area TA. As such, when the common electrode 230 is not disposed in the transmission area TA, the transmittance of the transmission area TA may be improved by about 1.5 times or more, as compared with a case in which the common electrode 230 is disposed in the transmission area TA. Therefore, in the second display area DA2, the common electrode 230 may have a patterned shape for each pixel area PX. To this end, a partial region of the common electrode 230 corresponding to the transmission area TA may be removed by laser lift-off, or the common electrode 230 is not formed in the transmission area TA through fine metal mask ("FMM") patterning.

Not only the common electrode 230 but also the pixel circuit PC and the organic light-emitting device OLED are not located in the transmission area TA. That is, the transmission area TA may be defined as an area in which no metal layer is located so as to improve the transmittance. In addition, in order to improve the transmittance of the transmission area TA, at least one layer among the layers arranged on the substrate 101 may be removed from the transmission area TA. FIG. 7 illustrates an example in which openings OP are defined in the pixel defining layer 119 and the planarization layer 117 in the transmission area TA. However, exemplary embodiments according to the invention are not limited thereto. In another exemplary embodiment, part of the interlayer insulating layer 115 to the buffer layer 111 arranged below the planarization layer 117 may be further removed from the transmission area TA.

A blocking layer BSM may be arranged between the substrate 101 and the semiconductor layer 1130 at a position overlapping the pixel area PX in the second display area DA2. The blocking layer BSM may include a metal material and may prevent the TFT from being affected by the optical signal or the acoustic signal of the adjacent component CP. In addition, when the component CP is an optical sensor, the blocking layer BSM may prevent diffraction of light generated by the optical sensor. For example, the blocking layer BSM may be located between the first buffer layer 111a and the second buffer layer 111b.

In addition, an encapsulation layer 300 including a first inorganic encapsulation layer 310, a second inorganic encapsulation layer 320, and an organic encapsulation layer 330 therebetween may be arranged on the common electrode 230.

The first inorganic encapsulation layer 310 and the second inorganic encapsulation layer 320 may each include one or more inorganic insulating materials selected from aluminum oxide, titanium oxide, tantalum oxide, hafnium oxide, zinc oxide, silicon oxide, silicon nitride, and silicon oxynitride. The organic encapsulation layer 330 may include polyethylene terephthalate, polyethylene naphthalate, polycarbonate, polyimide, polyethylenesulfonate, polyoxymethylene, polyarylate, hexamethyldisiloxane, an acryl-based resin (e.g., polymethylmethacrylate, polyacrylic acid, etc.), or any combination thereof.

As described above, the single sub-pixel SPX may include a plurality of contact holes 1151 to 1158 to electrically connect the layers arranged above and below the contact holes 1151 to 1158. The contact holes 1151 to 1158 may be passages configured to discharge hydrogen gas or the like generated in the process of manufacturing the display panel 100 to the outside. More specifically, hydrogen included in the inorganic layer such as the first and second gate insulating layers 112 and 113 may diffuse into the semiconductor layer 1130, and hydrogen diffusing into the semiconductor layer 1130 may affect a doping concentration of the channel region. Therefore, when the diffusion degree of hydrogen is different for each sub-pixel SPX, a characteristic difference (e.g., I-V characteristics) may occur for each sub-pixel SPX, thus causing deterioration of image quality of the display panel 100.

In particular, as illustrated in FIG. 3, the second display area DA2 includes the transmission area TA and the pixel area PX, but the pixel circuit PC or the like is not arranged in the transmission area TA. Therefore, the number of contact holes around the sub-pixels SPX may vary according to the position of the sub-pixel SPX. For example, when the sub-pixels SPX emitting light of a green color (G), a blue color (B), and a red color (R) are arranged as illustrated in FIG. 3, three sub-pixels SPX are located around a first red sub-pixel SPXR1 arranged in a first row of the pixel area PX, and five sub-pixels SPX are positioned around a second red sub-pixel SPXR2 arranged in a second row. Therefore, the number of contact holes formed around the first red sub-pixel SPXR1 is different from the number of contact holes formed around the second red sub-pixel SPXR2. As a result, a difference may occur in the amount of hydrogen that may be discharged through the contact holes in the process of manufacturing the first red sub-pixel SPXR1 and the second red sub-pixel SPXR2. Therefore, I-V characteristics (i.e., relation between current through and voltage across of the sub-pixel) of the first red sub-pixel SPXR1 may be different from I-V characteristics of the second red sub-pixel SPXR2. That is, even when the same voltage is applied to the first red sub-pixel SPXR1 and the second red sub-pixel SPXR2, the brightness of the first red sub-pixel SPXR1 may be different from the brightness of the second red sub-pixel SPXR2, thus deteriorating the image quality of the display apparatus 10.

In order to prevent the deterioration of the image quality of the display apparatus 10, a dummy contact hole DCNT may be further defined in the second display area DA2. The dummy contact hole DCNT may have the same configuration as that of one of the contact holes defined up to the semiconductor layer 1130 among the contact holes 1151 to 1158 defined in the pixel circuit PC. As illustrated in FIG. 7, the dummy contact hole DCNT may pass through the inorganic insulating layer on the emission control TFT T6. For example, the dummy contact hole DCNT may pass through the second gate insulating layer 113 and the interlayer insulating layer 115 to reach the first gate insulating layer 112. However, a difference between the dummy contact hole DCNT and other contact holes is that a metal does not fill the dummy contact hole DCNT compared to that a metal fills the other contact holes. Rather, the planarization layer 117 may fill the dummy contact hole DCNT.

The dummy contact hole DCNT in the transmission area TA may be defined adjacent to the pixel area PX. For example, when the pixel areas PX form a grid pattern, a plurality of dummy contact holes DCNT may be arranged along the edge of the transmission area TA at positions adjacent to the pixel areas PX as shown in FIGS. 3 and 6.

In another exemplary embodiment, the dummy contact hole DCNT may be arranged in the pixel area PX as shown in FIG. 7. In a case that the pixel areas PX form a grid pattern, dummy contact holes DCNT may be defined in sub-pixels SPX adjacent to two transmission areas TA among a plurality of sub-pixels SPX arranged in the pixel areas PX. For example, since the first red sub-pixels SPXR1 of FIG. 3 are in contact with the transmission areas TA on the left side and the upper side, in a plan view, the dummy contact holes DCNT may be defined in the first red sub-pixels SPXR1. Due to this, the degree of hydrogen emission in the process of manufacturing the first red sub-pixels SPXR1 may be similar to that in the process of manufacturing the second red sub-pixels SPXR2, thereby minimizing a characteristic difference between the first red sub-pixels SPXR1 and the second red sub-pixels SPXR2. In addition, the number of contact holes around the sub-pixel SPX arranged in the first display area DA1 may be different from the number of contact holes around the sub-pixel SPX arranged in the second display area DA2. Therefore, in another exemplary embodiment, a characteristic difference between the sub-pixels SPX arranged in the first display area DA1 and the sub-pixels SPX arranged in the second display area DA2 may be minimized by further forming dummy contact holes DCNT in the pixel areas PX in the second display area DA2.

When the dummy contact holes DCNT are defined in the pixel area PX, the dummy contact holes DCNT may be defined at positions not overlapping the metal layers included in the pixel circuit PC as illustrated in FIG. 5. As another example, a dummy line may be added on an existing line, or an additional line bypassing an existing line may be added, and a dummy contact hole DCNT may be defined therebetween.

As such, in the second display area DA2, the dummy contact hole DCNT may be defined in at least one of the transmission area TA and the pixel area PX. Therefore, even when the second display area DA2 includes the transmission area TA, the characteristics (e.g., I-V characteristics) of the sub-pixel SPX adjacent to the transmission area TA may be prevented or minimized from being different from those of other sub-pixels SPX.

As described with reference to FIG. 7, the layers stacked on the substrate 101 may be removed from the transmission area TA. In this case, the opening OP in the transmission area TA may be defined to include the dummy contact hole DCNT. That is, the layers stacked on the substrate 101 may be removed from the entire transmission area TA, and, therefore, no separate dummy contact hole DCNT from the opening OP may be defined in the transmission area TA.

Figure 9:
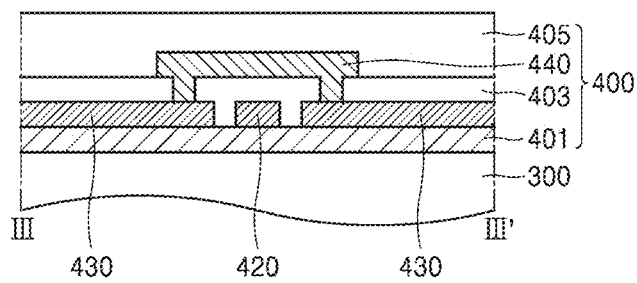
FIG. 9 is a cross-sectional view taken along line III-III' of FIG. 8.
Figure 10:
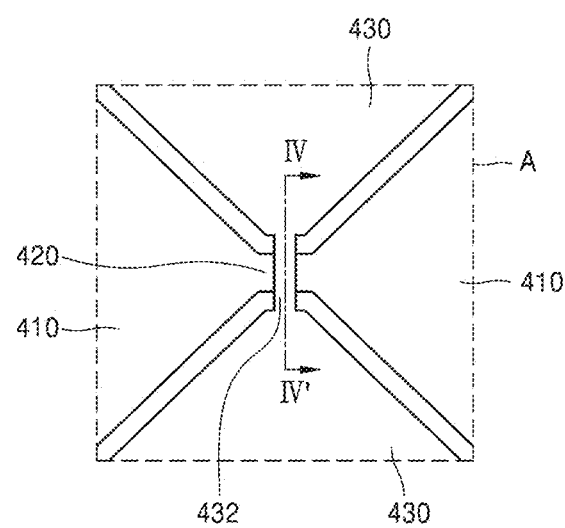
FIG. 10 is a plan view schematically illustrating another example of region A of FIG. 1.
Figure 11:
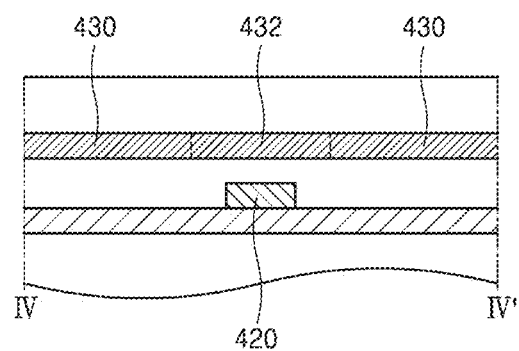
FIG. 11 is a cross-sectional view taken along line IV-IV' of FIG. 10.
Figure 12:
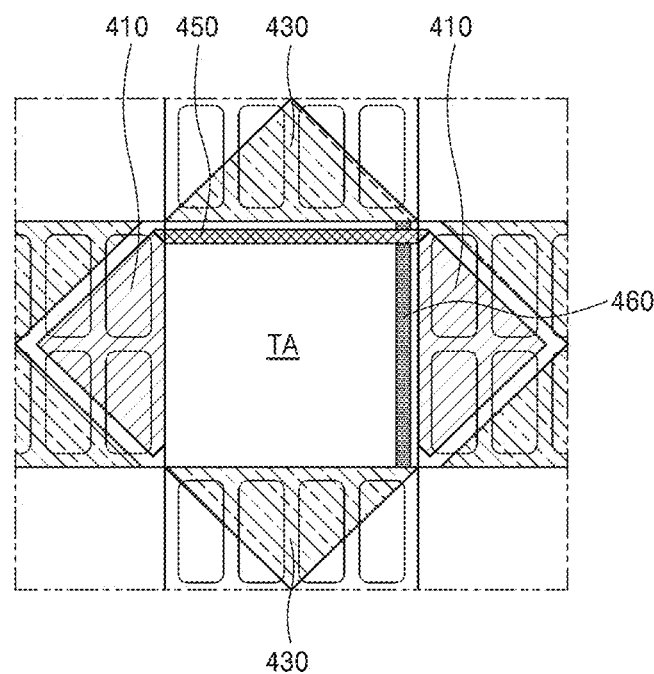
FIG. 12 is a plan view schematically illustrating an example of region B of FIG. 1.

FIG. 8 is a plan view schematically illustrating an example of region A of FIG. 1, FIG. 9 is a cross-sectional view taken along line III-III' of FIG. 8, FIG. 10 is a plan view schematically illustrating another example of region A of FIG. 1, and FIG. 11 is a cross-sectional view taken along line IV-IV' of FIG. 10. FIG. 12 is a plan view schematically illustrating an example of region B of FIG. 1.

Referring to FIGS. 8 and 9, the input sensor 400 of FIG. 1 may be directly disposed on the display panel 100 of FIG. 1. For example, the input sensor 400 of FIG. 1 may be directly disposed on the encapsulation layer 300. Therefore, the thickness of the display apparatus 10 of FIG. 1 may be reduced. As another example, after the input sensor 400 of FIG. 1 is formed on a substrate (not illustrated), the substrate (not illustrated) may be bonded to the encapsulation layer 300.

The first sensing electrodes 410 and the second sensing electrodes 430 may have a mesh shape as shown in FIG. 8. In this case, the first sensing electrodes 410 and the second sensing electrodes 430 may each include an opaque metal layer. In another exemplary embodiment, the first sensing electrodes 410 and the second sensing electrodes 430 may each include a transparent conductive layer. The transparent conductive layer may include a transparent conductive oxide, such as indium tin oxide (ITO), indium zinc oxide (IZO), zinc oxide (ZnO), or indium tin zinc oxide ("ITZO"). In addition, the transparent conductive layer may include a conductive polymer such as poly(3,4-ethylenedioxythiophene) ("PEDOT"), metal nanowires, graphene, or the like, for example.

Two first sensing electrodes 410 adjacent to each other in the first direction (e.g., x direction) may be connected to each other by a first connection portion 420. The first connection portion 420 may be located in the same layer as that of the first sensing electrode 410. The first connection portion 420 may be integrally formed with the first sensing electrode 410.

Two second sensing electrodes 430 adjacent to each other in the second direction (e.g., y direction) perpendicular to the first direction (e.g., x direction) may be connected to each other by a bridge line 440. The bridge line 440 may be located in a different layer from that of the first sensing electrode 410 and the second sensing electrode 430. For example, the bridge line 440 may be located on the first sensing electrode 410 and the second sensing electrode 430.

For example, as illustrated in FIG. 9, a first touch insulating layer 401 may be disposed on the encapsulation layer 300 so as to improve the bonding force between the encapsulation layer 300 and the input sensor 400 of FIG. 1, and the first sensing electrode 410 and the second sensing electrode 430 may be located on the first touch insulating layer 401. In addition, a second touch insulating layer 403 may be disposed on the first sensing electrode 410 and the second sensing electrode 430, and the bridge line 440 may be located on the second touch insulating layer 403. In this case, the bridge line 440 and the second sensing electrode 430 may be electrically connected to each other through a contact hole defined in the second touch insulating layer 403.

The first touch insulating layer 401 and the second touch insulating layer 403 may each include at least one of aluminum oxide, titanium oxide, silicon oxide, silicon oxynitride, zirconium oxide, and hafnium oxide, for example.

In addition, a third touch insulating layer 405 may be disposed on the bridge line 440. For example, the third touch insulating layer 405 may include at least one of an acryl-based resin, a methacryl-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin, for example.

Since the bridge line 440 and the first connection portion 420 intersect each other at different layers, parasitic capacitance between the bridge line 440 and the first connection portion 420 may be reduced by minimizing the width in the first direction of the bridge line 440. In addition, the bridge line 440 may include a material having a resistance lower than that of the second sensing electrode 430 so as to improve sensing sensitivity, and two or more bridge lines 440 may be disposed. For example, the bridge line 440 may include molybdenum, silver, titanium, copper, aluminum, and any alloy thereof, for example.

An example in which the first sensing electrode 410 and the second sensing electrode 430 are located in the same layer has been described with reference to FIGS. 8 and 9, but exemplary embodiments according to the invention are not limited thereto. In another exemplary embodiment, as illustrated in FIGS. 10 and 11, first sensing electrodes 410 and second sensing electrodes 430 may be located in different layers from each other.

Referring to FIGS. 10 and 11, two adjacent first sensing electrodes 410 may be connected to each other by a first connection portion 420, and two adjacent second sensing electrodes 430 may be connected to each other by a second connection portion 432. The first connection portion 420 may be integrally formed with the first sensing electrodes 410, and the second connection portion 432 may be integrally formed with the second sensing electrodes 430. Therefore, the first connection portion 420 and the second connection portion 432 may intersect each other at different layers.

FIG. 12 illustrates a part of the second display area DA2 of FIG. 1. In order to improve the opening ratio of the transmission area TA, the first sensing electrodes 410 and the second sensing electrodes 430 may not be disposed at positions overlapping the transmission area TA in a plan view. Therefore, the first sensing electrodes 410 may be separated from each other by the transmission area TA therebetween, and the second sensing electrodes 430 may also be separated from each other by the transmission area TA therebetween. Due to this, the touch sensitivity of the input sensor 400 of FIG. 1 may be reduced in the second display area DA2 of FIG. 1.

In order to prevent the reduction in the touch sensitivity of the input sensor 400 in the second display area DA2, the first sensing electrodes 410 separated from each other by the transmission area TA may be connected to each other through a first connection line 450, and the second sensing electrodes 430 may be connected to each other by a second connection line 460. The first connection line 450 may extend in the same direction (e.g., the first direction) as the direction in which the first sensing electrodes 410 are arranged, and the second connection line 460 may extend in parallel with the direction (e.g., the second direction) in which the second sensing electrodes 430 are arranged, thereby intersecting the first connection line 450. Therefore, in order to prevent a short circuit between the first connection line 450 and the second connection line 460, the first connection line 450 and the second connection line 460 may be located in different layers from each other.

For example, when the first sensing electrodes 410 and the second sensing electrodes 430 are located in the same layer as illustrated in FIGS. 8 and 9, one of the first connection line 450 and the second connection line 460 may be located in the same layer as that of the first sensing electrodes 410 and the second sensing electrodes 430, and the other of the first connection line 450 and the second connection line 460 may be located in the same layer as that of the bridge line 440.

In an exemplary embodiment, for example, when the first connection line 450 is located in the same layer as that of the first sensing electrodes 410 and the second sensing electrodes 430, the first connection line 450 may have the same configuration as that of the first connection portion 420. In order to prevent a short circuit between the first sensing electrode 410 and the second sensing electrode 430 due to the first connection line 450, the first connection line 450 has to be spaced apart from the second sensing electrode 430. For example, the first connection line 450 may be located in the transmission area TA. More specifically, the first connection line 450 may be arranged at a position overlapping the dummy contact hole DCNT of FIG. 3 defined in the transmission area TA. Therefore, it is unnecessary to further reduce the area of the second sensing electrode 430 so as to minimize the reduction of the opening ratio of the transmission area TA and to be apart from the first connection line 450, thereby preventing the touch sensitivity of the input sensor 400 of FIG. 1 from being reduced.

The second connection line 460 located in a different layer from that of the first connection line 450 may also be arranged at a position overlapping the dummy contact hole DCNT of FIG. 3 defined in the transmission area TA. Since the second connection line 460 is located in a different layer from that of the first sensing electrode 410, a short circuit does not occur even when the second connection line 460 overlaps the first sensing electrode 410. However, in a plan view, since the second connection line 460 is apart from the first sensing electrode 410, parasitic capacitance between the second connection line 460 and the first sensing electrode 410 may be prevented from occurring.

In another exemplary embodiment, when the first sensing electrodes 410 and the second sensing electrodes 430 are arranged in different layers as illustrated in FIGS. 10 and 11, the first connection line 450 may have the same configuration as that of the first connection portion 420, and the second connection line 460 may have the same configuration as that of the second connection portion 432. In addition, the first connection line 450 and the second connection line 460 may be arranged at positions overlapping at least one of the dummy contact holes DCNT of FIG. 3 defined in the transmission area TA. Therefore, parasitic capacitance between the first connection line 450 and the second sensing electrode 430 and parasitic capacitance between the second connection line 460 and the first sensing electrode 410 may be prevented from occurring.

As described above, the first sensing electrodes 410 and the second sensing electrodes 430 may have a mesh shape for transmissive properties. In this case, the widths of the first connection line 450 and the second connection line 460 may be greater than the width of the metal line constituting the mesh, thereby improving the touch sensitivity of the input sensor 400 of FIG. 1.

According to one or more exemplary embodiments, since the dummy contact hole is defined in at least one of the transmission area and the pixel area, it is possible to prevent or minimize characteristics (e.g., I-V characteristics) of the sub-pixels adjacent to the transmission area from being different from characteristics of the other sub-pixels. Furthermore, the sensing electrodes separated from each other by the transmission area therebetween are connected to each other through the connection line, and the connection line is located to overlap the dummy contact hole, thereby preventing the deterioration of the touch sensitivity of the touch inputting unit while maintaining the opening ratio of the transmission area.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first display area comprising a plurality of pixel areas;
   a second display area comprising a plurality of pixel areas and a plurality of transmission areas and located adjacent to the first display area; and
   a peripheral area located outside a display area comprising the first display area and the second display area,
   wherein the plurality of pixel areas each comprises sub-pixels each comprising a pixel circuit and an organic light-emitting device electrically connected to the pixel circuit,
   wherein the transmission areas and the pixel areas are alternately disposed in the second display area,
   the pixel circuit comprises a thin-film transistor and an inorganic insulating layer on the thin-film transistor, the thin-film transistor comprising a semiconductor layer and a gate electrode,
   the inorganic insulating layer extends in the transmission areas, and
   the second display area defines a dummy contact hole which passes through the inorganic insulating layer in at least one of the pixel areas and the transmission areas.

2. The display apparatus of claim 1, wherein the organic light-emitting device comprises a pixel electrode, a common electrode on the pixel electrode, and an intermediate layer located between the pixel electrode and the common electrode and comprising an emission layer, and
   the common electrode is integrally provided over the plurality of pixel areas and is not located in the transmission areas.

3. The display apparatus of claim 2, wherein, in the second display area, the plurality of pixel areas forms a grid pattern and the transmission areas are located between the pixel areas, and
   the dummy contact hole is defined in a sub-pixel adjacent to two transmission areas of the transmission areas among the sub-pixels included in each of the pixel areas of the second display area.

4. The display apparatus of claim 3, wherein the dummy contact hole does not overlap the metal layers included in the pixel circuit in a plan view.

5. The display apparatus of claim 1, further comprising a connection metal connected to the semiconductor layer on the inorganic insulating layer, and a planarization layer on the connection metal,
   wherein the organic light-emitting device is located on the planarization layer, and the planarization layer fills the dummy contact hole.

6. The display apparatus of claim 1, wherein the semiconductor layer is located on a substrate, and
   the display apparatus further comprises a blocking layer in the second display area, the blocking layer overlapping the pixel areas in a plan view and being located between the substrate and the semiconductor layer.

7. The display apparatus of claim 6, further comprising a buffer layer in which a first buffer layer and a second buffer layer comprising different materials from each other are stacked, the buffer layer being arranged on the substrate, and
   wherein the blocking layer is arranged between the first buffer layer and the second buffer layer.

8. The display apparatus of claim 1, wherein the dummy contact hole is provided in plural, and the plurality of dummy contact holes is located along an edge of the transmission area at a position adjacent to the pixel area of the second display area.

9. The display apparatus of claim 1, further comprising an input sensor arranged to correspond to the first display area and the second display area,
   wherein the input sensor comprises first sensing electrodes and second sensing electrodes,
   the first sensing electrodes separated from each other by the transmission area are connected to each other through a first connection line, and the second sensing electrodes separated from each other by the transmission area are connected to each other through a second connection line extending in a direction perpendicular to a direction in which the first connection line extends, and
   the first connection line and the second connection line are located on different layers from each other.

10. The display apparatus of claim 9, wherein the dummy contact hole is provided in plural, and the first connection line and the second connection line overlap at least one of the dummy contact holes in a plan view.

11. A display apparatus comprising:
    a display panel comprising a first display area and a second display area which have different resolutions from each other; and
    an input sensor located on the display panel,
    wherein the second display area comprises a plurality of pixel areas and a plurality of transmission areas different from the plurality of pixel areas, the input sensor comprises first sensing electrodes electrically connected to each other and second sensing electrodes electrically connected to each other, the first sensing electrodes separated from each other by the transmission area are electrically connected to each other through a first connection line, and the second sensing electrodes separated from each other by the transmission area are electrically connected to each other through a second connection line extending in a direction perpendicular to a direction in which the first connection line extends, and the first connection line and the second connection line are located on different layers from each other.

12. The display apparatus of claim 11, wherein the first sensing electrodes and the second sensing electrodes are located in a same layer, and one of the first connection line and the second connection line is located in the same layer as the first sensing electrodes and the other of the first connection line and the second connection line is located in a different layer from the sensing electrodes.

13. The display apparatus of claim 11, wherein a layer in which the first sensing electrodes are located and a layer in which the second sensing electrodes are located are different from each other, and the first connection line is located in a same layer as the first sensing electrodes, and the second connection line is located in a same layer as the second sensing electrodes.

14. The display apparatus of claim 11, wherein the plurality of pixel areas each comprises sub-pixels each comprising a pixel circuit and an organic light-emitting device electrically connected to the pixel circuit, the pixel circuit comprises a thin-film transistor and an inorganic insulating layer on the thin-film transistor, the thin-film transistor comprising a semiconductor layer and a gate electrode, the inorganic insulating layer extends in the transmission areas, and the second display area defines a dummy contact hole passing through the inorganic insulating layer in at least one of the pixel areas and the transmission areas.

15. The display apparatus of claim 14, wherein, in the second display area, the plurality of pixel areas forms a grid pattern, and the transmission areas are located between the pixel areas, the dummy contact hole is provided in plural, and the plurality of dummy holes is located along edges of the transmission areas at positions adjacent to the pixel areas, and the first connection line and the second connection line overlap at least one of the plurality of dummy contact holes in a plan view.

16. The display apparatus of claim 14, further comprising a connection metal connected to the semiconductor layer on the inorganic insulating layer, and a planarization layer on the connection metal, wherein the organic light-emitting device is located on the planarization layer, and the planarization layer fills the dummy contact hole.

17. The display apparatus of claim 16, wherein the organic light-emitting device comprises a pixel electrode connected to the connection metal, a common electrode on the pixel electrode, and an intermediate layer located between the pixel electrode and the common electrode and comprising an emission layer, and the common electrode is integrally provided throughout the first display area and the second display area and is not located in the transmission areas.

18. The display apparatus of claim 14, wherein, in the second display area, the plurality of pixel areas forms a grid pattern and the transmission areas are located between the pixel areas, and the dummy contact hole is defined in a sub-pixel adjacent to two transmission areas of the transmission areas among the sub-pixels included in each of the pixel areas.

19. The display apparatus of claim 18, wherein the dummy contact hole does not overlap metal layers included in the pixel circuit in a plan view.

20. The display apparatus of claim 14, wherein the semiconductor layer is located on a substrate, and the display apparatus further comprises:

a blocking layer overlapping the pixel areas in a plan view and located between the substrate and the semiconductor layer, and a component arranged below the substrate at a position overlapping the pixel areas and the transmission areas, and which senses an external signal.

\* \* \* \* \*